(12) United States Patent
Abe

(10) Patent No.: US 7,120,716 B2
(45) Date of Patent: Oct. 10, 2006

(54) SEMICONDUCTOR INTEGRATED CIRCUIT AND INTERRUPT REQUEST OUTPUT METHOD THEREOF

(75) Inventor: Shinichi Abe, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 445 days.

(21) Appl. No.: 10/697,650

(22) Filed: Oct. 31, 2003

(65) Prior Publication Data

US 2004/0169199 A1 Sep. 2, 2004

(30) Foreign Application Priority Data

Nov. 1, 2002 (JP) .......................... P.2002-320215

(51) Int. Cl.
*G00F 1/26* (2006.01)
*G06F 3/00* (2006.01)
*H04M 1/66* (2006.01)

(52) U.S. Cl. .................. 710/260; 713/300; 710/48; 379/199

(58) Field of Classification Search ......... 710/260–269
See application file for complete search history.

(56) References Cited

U.S. PATENT DOCUMENTS 4,594,632 A * 6/1986 Unnewehr ................. 361/33
5,448,630 A * 9/1995 Barstow .................... 379/199
5,649,213 A   7/1997 Kurihara et al.
6,195,425 B1 * 2/2001 Sato ........................... 710/48
6,209,105 B1 * 3/2001 Hamamoto ................. 713/300
6,512,715 B1 * 1/2003 Okamoto et al. ........... 365/227
6,594,102 B1 * 7/2003 Kanda et al. ................ 360/75

FOREIGN PATENT DOCUMENTS

JP  1-255909 A  10/1989
JP  8-50523 A   2/1996
JP  9-44278 A   2/1997

* cited by examiner

*Primary Examiner*—Rehana Perveen
*Assistant Examiner*—Brian Misiura
(74) *Attorney, Agent, or Firm*—McDermott Will & Emery LLP

(57) ABSTRACT

There is provided a resistor unit 115 for bypassing an output cell 107 of an interrupt request signal and an input cell 108 of an external interrupt factor, and the output cell 107 of the interrupt request signal is controlled to a high impedance when an internal power source is broken. Thus, an interrupt request signal sent from the external interrupt factor is given to a CPU when the internal power source is broken.

4 Claims, 5 Drawing Sheets

SEMICONDUCTOR INTEGRATED CIRCUIT AND INTERRUPT REQUEST OUTPUT METHOD THEREOF

BACKGROUND OF THE INVENTION

1. Field of the Invention

The present invention relates to a semiconductor integrated circuit for outputting an OR output of an external interrupt factor and an internal interrupt factor as an interrupt request signal to an outside and an interrupt request output method of the semiconductor integrated circuit.

2. Description of the Related Art

In some system structures using a semiconductor integrated circuit, an interrupt request signal given from an external interrupt factor is fetched into the semiconductor integrated circuit and OR control with an interrupt request signal given from an internal interrupt factor is carried out therein, and they are thus aggregated into one interrupt request signal and a notification of the interrupt is given to a CPU.

FIG. 5 is a block diagram showing a system structure related to such a conventional interrupt processing. In FIG. 5, 501 denotes a semiconductor integrated circuit which includes an interrupt control circuit 511 for carrying out OR control of an internal or external interrupt factor. 502 denotes a CPU for processing an interrupt request given from the semiconductor integrated circuit 501, and 503 denotes a power supply unit controlled by the CPU 502 and supplying a power to the semiconductor integrated circuit 501. 504 denotes an external interrupt factor unit, and a low active interrupt signal sent from the external interrupt factor unit 504 is input to the semiconductor integrated circuit 501.

The semiconductor integrated circuit 501 is divided into an internal power source section 505a and an I/O power source section 505b by a power voltage supplied to the circuit, and is controlled by the CPU 502 and receives independent power supply from the power supply unit 503, respectively.

An input/output terminal cell is arranged in the I/O power source section 505b. 506 denotes an input cell for receiving an internal power source breaking mode signal from the CPU 502 in the power down mode of the semiconductor integrated circuit 501, 507 denotes an output cell for transmitting an interrupt request signal to the CPU 502, and 508 denotes an input cell for receiving an interrupt request signal generated from the external interrupt factor unit 504.

Since the internal power source section 505a and the I/O power source section 505b are operated at different voltages, a signal is transferred between a logic arranged in the internal power source section 505a and a logic arranged in the I/O power source section 505b through a voltage level shifter circuit. For this reason, the output cell 507 and the input cell 508 include voltage level shifter circuits 509 and 510, respectively.

The internal power source breaking mode signal is "1" active and the CPU 502 sets the same signal to be "1", thereby reporting the breaking of an internal power source to the semiconductor integrated circuit 501 in advance. Prior to a transition to the power down mode of the semiconductor integrated circuit 501, the CPU 502 first sets the internal power source breaking mode signal to be sent to the input cell 506 of the semiconductor integrated circuit 501 to be "1" and the logic of the output cell of the I/O power source section 505b is fixed to either of stable directions of "H" and "L".

The output cell 507 is fixed to "H" in an internal power source breaking mode.

Then, the CPU 502 issues the internal power source breaking instruction of the semiconductor integrated circuit to the power supply unit 503, and the power supply unit 503 breaks a power source for the internal power source section 505a of the semiconductor integrated circuit 501. By such a serial procedure, the semiconductor integrated circuit 501 is subjected to a transition to the power down mode.

An interrupt control circuit 511 is provided in the internal power source section 505a, and carries out OR control of an external interrupt factor 512 output from the external interrupt factor unit 504 and transmitted to the internal power source section 505a through the input cell 508 and an internal interrupt factor group 513 generated in another circuit of the internal power source section 505a, and finally aggregates them into one interrupt request signal 514 and gives a notification to the CPU 502 through the output cell 507.

A technique for treating an interrupt signal related to the power down mode transition has been disclosed in Patent Document 1.

[Patent Document 1]

JP-A-9-44278 gazette

[Problems that the Invention is to Solve]

In the structure according to the conventional embodiment, however, the internal power source section is shut-off in the power down mode of the semiconductor integrated circuit, and at the same time, the interrupt control circuit provided in the internal power source section becomes inoperable and the output cell of the interrupt request signal which is provided in the I/O power source section is fixed to "H". Even if an interrupt request is given from the external interrupt factor to the input cell of the semiconductor integrated circuit, therefore, the notification cannot be sent to the CPU.

In this case, the notification, to the CPU, of the interrupt request given from the external interrupt factor is stopped while the semiconductor integrated circuit is set in the power down mode. If the notification cannot be stopped, an interrupt request signal input for the external interrupt factor is to be provided on the CPU side separately from the input of the interrupt request signal sent from the output cell of the semiconductor integrated circuit.

SUMMARY OF THE INVENTION

The invention has been made in consideration of the circumstances and has an object to provide a semiconductor integrated circuit for outputting an OR output of an external interrupt factor and an internal interrupt factor as an interrupt request signal to an outside, wherein an interrupt request sent from the external interrupt factor can be given to the outside also when an internal power source is shut-off, and an interrupt request output method of the semiconductor integrated circuit.

In order to attain the object, a first aspect of the invention is directed to a semiconductor integrated circuit for outputting an OR output of an external interrupt factor and an internal interrupt factor as an interrupt request signal to an outside, comprising a resistor unit for bypassing an output end of the interrupt request signal to an input end of the external interrupt factor, and control means for controlling the output end of the interrupt request signal to a high impedance when an internal power source is shut-off.

According to the structure, the input end of the external interrupt factor and the output end of the interrupt request signal are bypassed through the resistor unit. Consequently, the interrupt request sent from the external interrupt factor can be given to the outside also when the internal power source of the semiconductor integrated circuit is shut-off.

A second aspect of the invention is directed to a semiconductor integrated circuit for outputting an OR output of an external interrupt factor and an internal interrupt factor as an interrupt request signal to an outside, comprising at least one rectifying unit for bypassing an output end of the interrupt request signal and at least one of input ends of the external interrupt factor to each other in an I/O power source section in which supply of a power is continuously carried out also after an internal power source is shut-off.

According to the structure, the input end of the external interrupt factor and the output end of the interrupt request signal are bypassed through the rectifying unit. Consequently, the interrupt request sent from the external interrupt factor can be given to the outside also when the internal power source of the semiconductor integrated circuit is shut-off. Moreover, at least one rectifying unit constitutes an OR circuit. Even if a plurality of external interrupt factors are generated, therefore, they can be reliably given as the interrupt requests to the outside. Furthermore, the rectifying unit to carry out the bypassing is provided in the I/O power source section in which the supply of the power is continuously performed also when the internal power source is shut-off Consequently, it is possible to give the interrupt request sent from the external interrupt factor to the outside without adding a circuit to the outside.

A third aspect of the invention is directed to a semiconductor integrated circuit for outputting an OR output of an external interrupt factor and an internal interrupt factor as an interrupt request signal to an outside, comprising switching means provided in an I/O power source section in which supply of a power is continuously carried cut also after an internal power source is shut-off and bypassing an output end of the interrupt request signal to an input end of the external interrupt factor by a switching operation interlocked with the breaking of the internal power source, and control means for controlling the output end of the interrupt request signal to a high impedance when the internal power source is shut-off.

According to the structure, the input end of the external interrupt factor and the output end of the interrupt request signal are bypassed by the switching means to be switched interlockingly with the breaking of the internal power source, and are cut off from the circuit except for the time of the breaking of the internal power source and are bypassed only when the internal power source is shut-off. Consequently, the interrupt request sent from the external interrupt factor can be given to the outside. Moreover, the switching means is provided in the I/O power source section in which the supply of the power is continuously carried out also when the internal power source is shut-off. Consequently, it is possible to give the interrupt request sent from the external interrupt factor to the outside without adding a circuit to the outside.

A fourth aspect of the invention is directed to a semiconductor integrated circuit for outputting an OR output of an external interrupt factor to an internal interrupt factor as an interrupt request signal to an outside, comprising switching means provided in an I/O power source section in which supply of a power is continuously carried out also after an internal power source is shut-off and bypassing an output end of the interrupt request signal to an input end of the external interrupt factor by a switching operation for responding to an external control signal, and control means for controlling the output end of the interrupt request signal to a high impedance when the external control signal is supplied.

According to the structure, the switching means can be directly controlled by using the external control signal and the interrupt request sent from the external interrupt factor can be given to the outside also when the internal power source is shut-off, and furthermore, the switching means can be controlled only if necessary in a soft ware processing. Moreover, the switching means is provided in the I/O power source section in which the supply of a power is continuously carried out also when the internal power source is shut-off. Consequently, it is possible to give the interrupt request sent from the external interrupt factor to the outside without adding a circuit to the outside.

A fifth aspect of the invention is directed to an interrupt request output method of a semiconductor integrated circuit for outputting an OR output of an external interrupt factor and an internal interrupt factor as an interrupt request signal to an outside, wherein an output end of the interrupt request signal is controlled to a high impedance when an internal power source is shut-off, and an interrupt request signal supplied to an input end of the external interrupt factor is output to an outside through a resistor unit bypassing the output end of the interrupt request signal to the input end of the external interrupt factor.

According to the structure, the input end of the external interrupt factor and the output end of the interrupt request signal are bypassed through the resistor unit. Also when the internal power source of the semiconductor integrated circuit is shut-off, consequently, the interrupt request sent from the external interrupt factor can be given to the outside.

A sixth aspect of the invention is directed to an interrupt request output method of a semiconductor integrated circuit for outputting an OR output of an external interrupt factor and an internal interrupt factor as an interrupt request signal to an outside, wherein an interrupt request signal supplied to at least one of input ends of the external interrupt factor is output to an outside through at least one rectifying unit bypassing an output end of the interrupt request signal and at least one of the input ends of the external interrupt factor to each other.

According to the structure, the interrupt request sent from the external interrupt factor can be given to the outside through the rectifying unit bypassing the input end of the external interrupt factor and the output end of the interrupt request signal also when the internal power source of the semiconductor integrated circuit is shut-off.

A seventh aspect of the invention is directed to an interrupt request output method of a semiconductor integrated circuit for outputting an OR output of an external interrupt factor and an internal interrupt factor as an interrupt request signal to an outside, wherein an output end of the interrupt request signal is controlled to a high impedance and the output end of the interrupt request signal and an input end of the external interrupt factor are bypassed through switching means to be closed when an internal power source is shut-off during the breaking of the internal power source, and an interrupt request signal supplied to the input end of the external interrupt factor is output to the outside.

According to the invention, a disconnection from the circuit is carried out except for the breaking of the internal power source by bypassing the input end of the external interrupt factor to the output end of the interrupt request signal through the switching means for switching interlockingly with the breaking of the internal power source.

An eighth aspect of the invention is directed to an interrupt request output method of a semiconductor integrated circuit for outputting an OR output of an interrupt request signal sent from an external interrupt factor and an internal interrupt factor as an interrupt request signal to an outside, wherein an output end of the interrupt request signal is controlled to a high impedance and the output end of the interrupt request signal and an input end of the external interrupt factor are bypassed through switching means to be closed when an external control signal is supplied during the supply of the external control signal, and an interrupt request signal supplied to the input end of the external interrupt factor is output to the outside.

According to the structure, the switching means can be directly controlled by using the external control signal and the interrupt request sent from the external interrupt factor can be given to the outside also when the internal power source is shut-off, and furthermore, the switching means can be controlled only if necessary in a software processing.

DESCRIPTION OF THE PREFERRED EMBODIMENTS

Embodiments of the invention will be described below with reference to the drawings.

Figure 1:
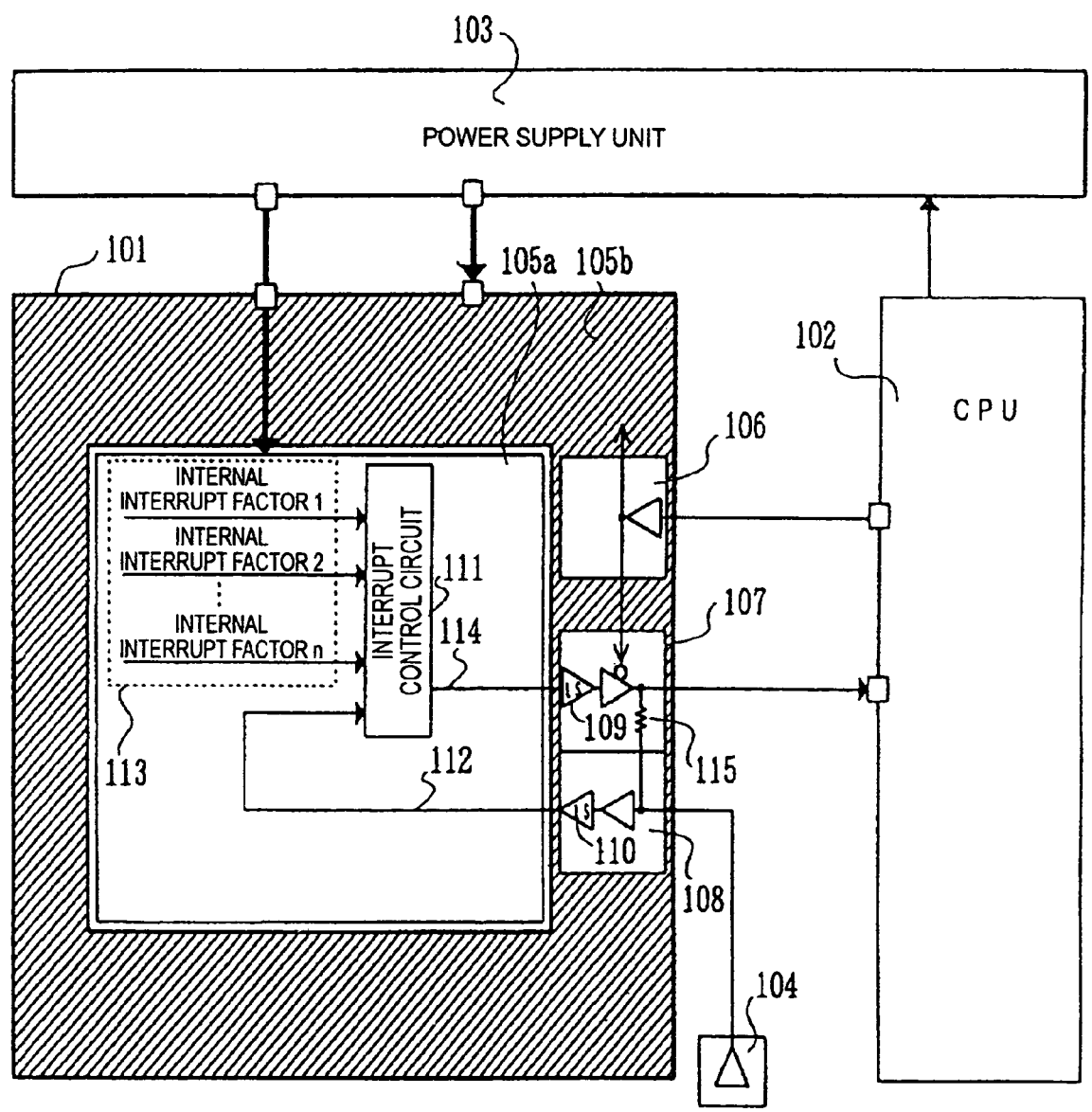
FIG. 1 is a block diagram showing a structure according to a first embodiment of the invention.

FIG. 1 is a block diagram showing a structure according to a first embodiment of the invention. In FIG. 1, 101 denotes a semiconductor integrated circuit including an interrupt control circuit for carrying out OR control of an interrupt factor generated on an inside or outside, 102 denotes a CPU for processing an interrupt request given from the semiconductor integrated circuit 101, and 103 denotes a power supply unit controlled by the CPU 102 and supplying a power to an internal power source section and an I/O power source section in the semiconductor integrated circuit 101. 104 denotes an external interrupt factor unit, and a low active interrupt signal sent from the external interrupt factor unit 104 is input to the semiconductor integrated circuit 101.

The semiconductor integrated circuit 101 is divided into an internal power source section 105a and an I/O power source section 105b by a power voltage supplied to the circuit, and is controlled by the CPU 102 and receives the independent supply of a power from the power supply unit 103, respectively.

An input/output terminal cell is arranged in the I/O power source section 105b. 106 denotes an input cell for receiving an internal power source breaking mode signal from the CPU 102 in the power down mode of the semiconductor integrated circuit 101, 107 denotes an output cell for transmitting an interrupt request signal to the CPU 102, and 108 denotes an input cell for receiving an interrupt request signal generated from the external interrupt factor unit 104.

Since the internal power source section 105a and the I/O power source section 105b are operated at different voltages, a signal is transferred between a logic arranged in the internal power source section 105a and a logic arranged in the I/O power source section 105b through a voltage level shifter circuit. For this reason, the output cell 107 and the input cell 108 include voltage level shifter circuits 109 and 110, respectively.

The internal power source breaking mode signal is "1" active and the CPU 102 sets the same signal to be "1", thereby reporting the breaking of an internal power source to the semiconductor integrated circuit 101 in advance. Prior to a transition to the power down mode of the semiconductor integrated circuit 101, the CPU 102 first sets, to "1", the internal power source breaking mode signal to be sent to the input cell 106 of the semiconductor integrated circuit 101 and the logic of the output cell of the I/O power source section 105b is fixed to either of stable directions of "H" and "L".

The output buffer of the output cell 107 is set to tri-state control and is controlled in such a manner that an output is "H" or "L" as usual if an internal power source breaking mode signal is "0", and the output is fixed to a high impedance if the internal power source breaking mode signal is "1".

Then, when the CPU 102 issues the internal power source breaking instruction of the semiconductor integrated circuit to the power supply unit 103, the power supply unit 103 breaks a power source for the internal power source section 105a of the semiconductor integrated circuit 101. By such a serial procedure, the semiconductor integrated circuit 101 is subjected to a transition to the power down mode.

An interrupt control circuit 111 is provided in the internal power source section 105a, and carries out OR control of an external interrupt factor 112 output from the external interrupt factor element 104 and transmitted to the internal power source section 105a through the input cell 108 and an internal interrupt factor group 113 generated in another circuit of the internal power source section 105a during a normal operation, that is, while a power is supplied to the internal power source section 105a, and finally aggregates them into one interrupt request signal 114 and gives a notification to the CPU 102 through the output cell 107.

The output cell 107 of the interrupt request signal and the input cell 108 of the interrupt request signal are provided close to each other in the I/O power source section 105b, and the output end of the output cell 107 and the input end of the input cell 108 are connected through a bypass resistor 115 in the I/O power source section 105b.

In the power down mode of the semiconductor integrated circuit 101, an internal power source breaking mode signal to be output from the CPU 102 and input from the input cell 106 is set to be "1" and the output of the output cell 107 is fixed to a high impedance.

Then, when the power supply unit 103 blocks the supply of a power to the internal power source section 105a of the semiconductor integrated circuit 101 in response to an internal power source breaking instruction sent from the CPU 102, all interrupt factors in the semiconductor integrated circuit 101 are inoperable. A low active interrupt request output from the external interrupt factor element 104 is given to the CPU 102 through the bypass resistor 115.

As described above, according to the embodiment, the input end of the external interrupt factor and the output end of the interrupt request signal to be sent to the CPU are bypassed through the resistor unit. Consequently, it is possible to give the interrupt request from the external interrupt factor unit 104 to the CPU 102 also during the internal power source breaking of the semiconductor integrated circuit 101.

Moreover, the CPU 102 recognizes that the interrupt factor group 113 generated in the semiconductor integrated circuit 101 is wholly inoperable by the power source breaking. When the CPU 102 receives an interrupt request from an interrupt input terminal in the breaking of the internal power source of the semiconductor integrated circuit 101, therefore, it is possible to immediately specify that the interrupt request is given from the external interrupt factor unit 104. Since the embodiment can be implemented by adding one resistor unit, moreover, the semiconductor integrated circuit can easily be provided in the I/O power source section.

Figure 2:
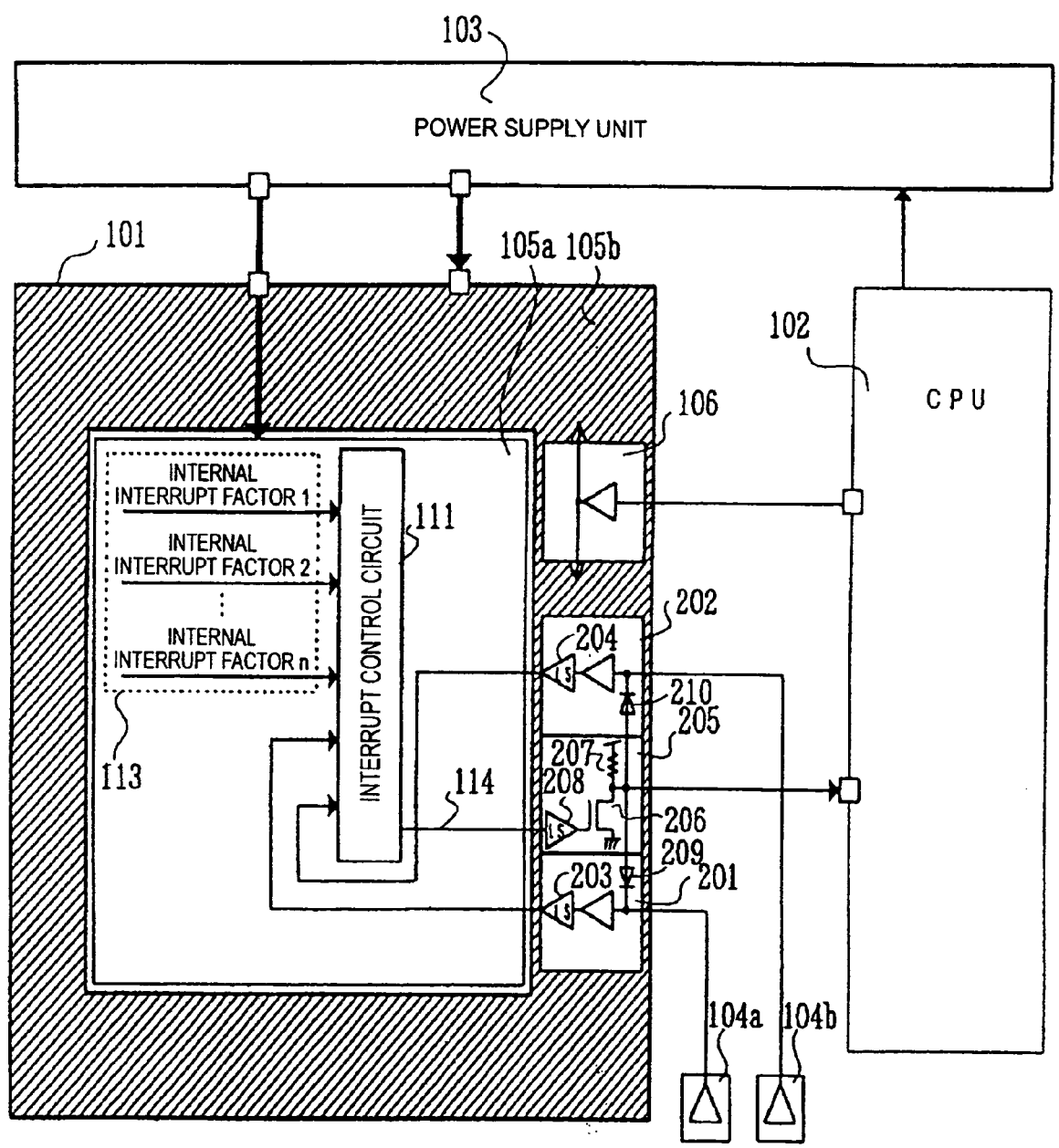
FIG. 2 is a block diagram showing a structure according to a second embodiment of the invention.

FIG. 2 is a block diagram showing a structure according to a second embodiment of the invention. The same portions as those in FIG. 1 have the same reference numerals and description will be given. In FIG. 2, two external interrupt request signals sent from an external interrupt factor unit a of 104a and an external interrupt factor unit b of 104b are input through input cells 201 and 202 to an interrupt control circuit 111 provided in an internal power source section 105a of a semiconductor integrated circuit 101, respectively.

203 and 204 denote level shifter circuits to be provided on the output side of the input cells 201 and 202 to the internal power source section, respectively. An interrupt request signal 114 aggregated into one by the interrupt control circuit 111 is given to a CPU 102 through an output cell 205.

208 denotes a level shifter circuit from the internal power source section 105a to an I/O power source section 105b which is provided on the input end of the output cell 205, 206 denotes an N channel transistor constituting the open drain output of the output cell 205, and 207 denotes a pull-up resistor connected between the drain of the N channel transistor 206 and the I/O power source. Rectifying units 209 and 210 are inserted from the output end of the output cell 205 to the input ends of the input cells 201 and 202 in a forward direction, respectively.

During a normal operation, that is, while a power is supplied to the internal power source section 105a, OR control of two external interrupt factors transmitted to the internal power source section 105a through the input cells 201 and 202 and the internal interrupt factor group 113 generated in another circuit of the internal power source section 105a is carried out, and is finally aggregated into one interrupt request output signal 114 and is given to the CPU 102 through an output cell 107.

In the power down mode of the semiconductor integrated circuit 101, an internal power source breaking mode signal to be output from the CPU 102 and input from an input cell 106 is set to be "1" and a power supply unit 103 then breaks the supply of a power to the internal power source section 105a of the semiconductor integrated circuit 101 upon receipt of the internal power source breaking instruction of the CPU 102.

Consequently, the interrupt control circuit 111 becomes inoperable and the N channel transistor 206 in the output cell 205 is turned OFF so that the output of the output cell 205 is set to be "H" by the pull-up resistor 207. When either of the two external interrupt factor units 104a and 104b becomes active and is changed into "L", however, the interrupt request signal input to the CPU 102 is set to be "L" through the rectifying units 209 and 210 so that an interrupt request is given to the CPU 102.

When the interrupt is given from an interrupt input terminal in the power down mode of the semiconductor integrated circuit 101, the CPU 102 turns ON the power source of the internal power source section 105a to specify that an interrupt is given from the external interrupt factor unit 104a or the external interrupt factor unit 104b through the interrupt control circuit 111 to be an interrupt signal path during a normal operation.

As described above, according to the embodiment, also in the case in which there are a plurality of external interrupt factors, it is possible to give the interrupt request from the external interrupt factor to the CPU 102 also when the internal power source of the semiconductor integrated circuit 101 is shut-off.

While the description has been given to the case in which there are two external interrupt factors in the embodiment, moreover, the same semiconductor integrated circuit as that in the embodiment can be implemented by providing bypass means using a rectifying unit for each of the external interrupt factors also when one or at least three external interrupt factor(s) is(are) present.

Figure 3:
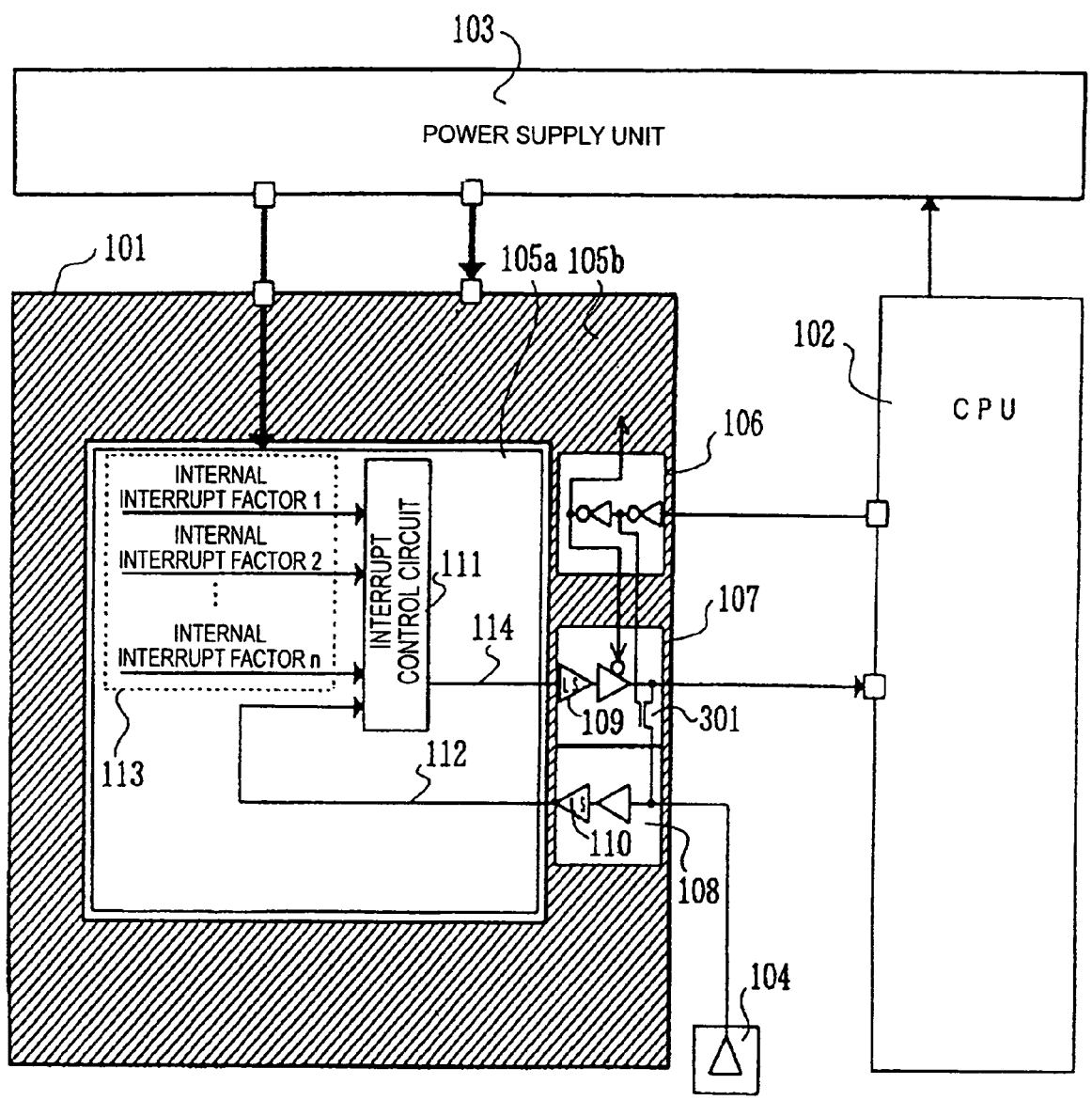
FIG. 3 is a block diagram showing a structure according to a third embodiment of the invention.

FIG. 3 is a block diagram showing a structure according to a third embodiment of the invention. The same portions as those in FIG. 1 have the same reference numerals and description will be given. In FIG. 3, 301 denotes a switching unit for bypass with which the bypass resistor 115 described in the first embodiment is replaced. The ON/OFF control of the switching unit 301 is switched in response to an internal power source breaking mode signal input to an input cell 106. Control is carried out in such a manner that the switching unit 301 is turned ON when the internal power source breaking mode signal is "1", and is turned OFF when the internal power source breaking mode signal is "0".

According to a circuit having the structure described above, it is possible to give an interrupt request from an external interrupt factor unit 104 to a CPU 102 through a switching unit also in the power down mode of a semiconductor integrated circuit 101. Moreover, the switching unit 301 for bypass is turned ON/OFF interlockingly with the power OFF/ON of an internal power source section 105a. Therefore, bypass means is automatically cut off in a mode other than the power down mode of the semiconductor integrated circuit.

Figure 4:
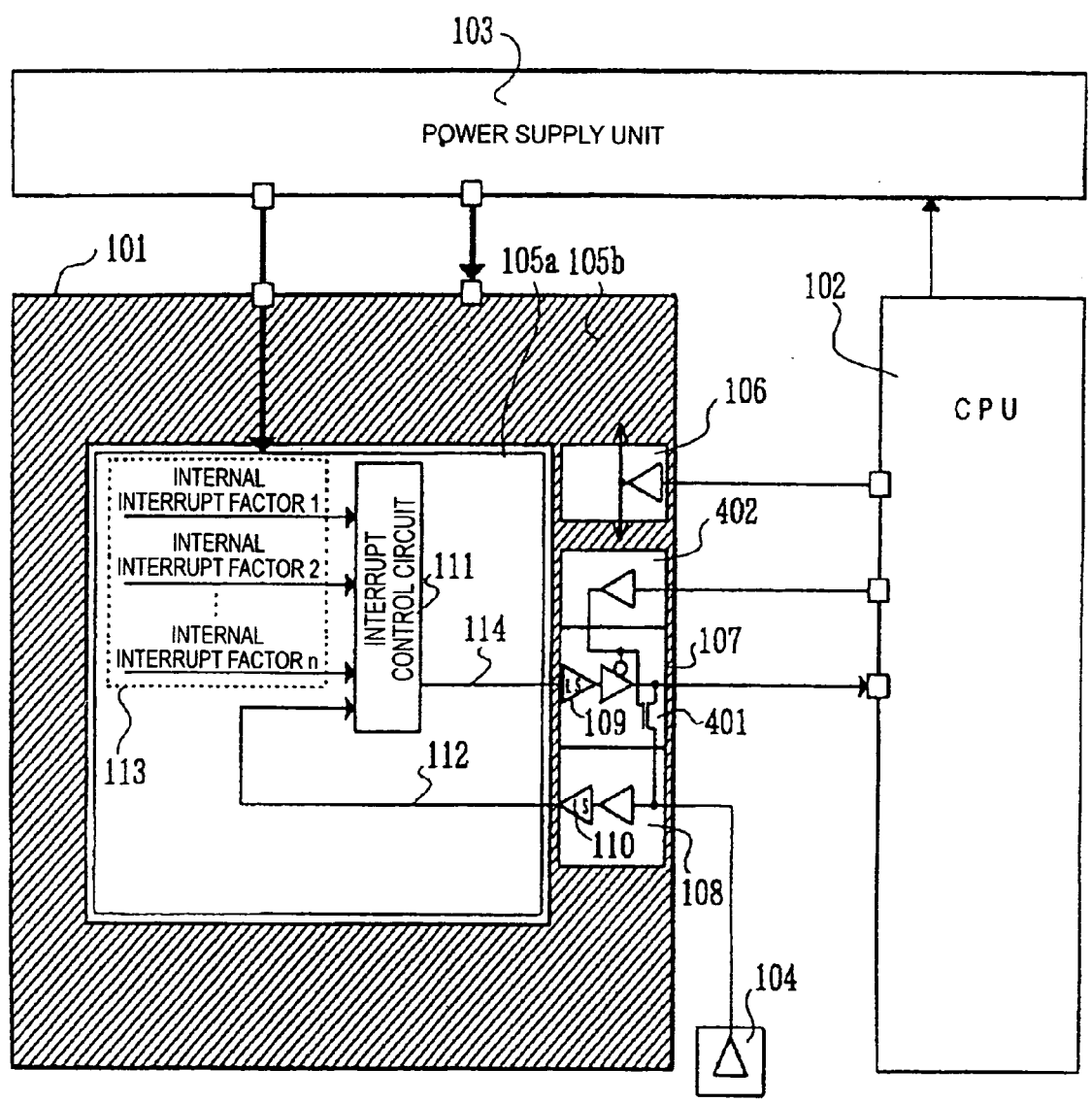
FIG. 4 is a block diagram showing a structure according to a fourth embodiment of the invention.
Figure 5:
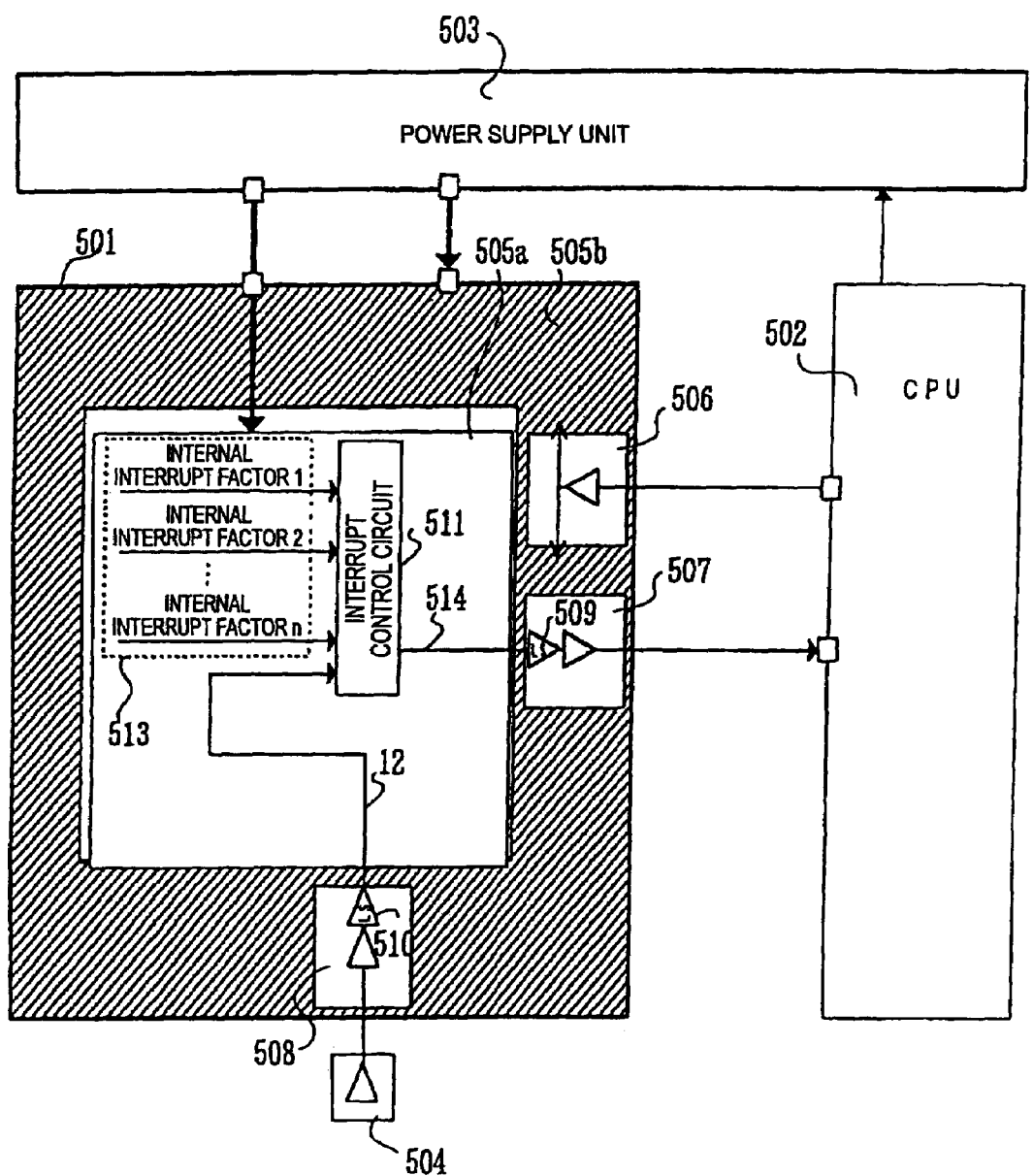
FIG. 5 is a block diagram showing the structure of a conventional semiconductor integrated circuit.

FIG. 4 is a block diagram showing a structure according to a fourth embodiment of the invention. The same portions as those in FIG. 1 have the same reference numerals and description will be given. In FIG. 4, 401 denotes the same switching unit for bypass as that of the third embodiment, of which ON/OFF control is carried out in response to a bypass control signal sent from a CPU which is input from an input cell 402 together with the output control of an output cell 107.

According to the structure, the bypass means of an interrupt signal in a semiconductor integrated circuit can be directly controlled through the port of the CPU. Also in the power down mode of the semiconductor integrated circuit, an interrupt request sent from an external interrupt factor can be given to the CPU, and furthermore, a bypass unit can be turned ON if necessary in the software processing of the CPU.

As described above, according to the invention, the external interrupt factor can be output as the interrupt request signal to the outside through the resistor unit or the rectifying unit which is bypassed to the outside of the semiconductor integrated circuit, or the switching means. When the internal power source of the semiconductor integrated circuit is shut-off, therefore, the interrupt request sent from the external interrupt factor can be given to the outside.

In the semiconductor integrated circuit, moreover, the rectifying unit or the switching means is provided in the I/O power source section. Consequently, the system can be constituted without adding a circuit to the outside and a cost of development can be minimized.

What is claimed is:

1. A semiconductor integrated circuit for outputting an OR output of an external interrupt factor and an internal interrupt factor as an interrupt request signal to an outside, comprising:

switching means provided in an I/O power source section in which supply of a power is continuously carried out also after an internal power source is shut-off and bypassing an output end of the interrupt request signal to an input end of the external interrupt factor by a switching operation interlocked with the breaking of the internal power source; and control means for controlling the output end of the interrupt request signal to a high impedance when the internal power source is shut-off.

2. A semiconductor integrated circuit for outputting an OR output of an external interrupt factor and an internal interrupt factor as an interrupt request signal to an outside, comprising:

switching means provided in an I/O power source section in which supply of a power is continuously carried out also after an internal power source is shut-off and bypassing an output end of the interrupt request signal to an input end of the external interrupt factor by a switching operation for responding to an external control signal; and control means for controlling the output end of the interrupt request signal to a high impedance when the external control signal is supplied.

3. An interrupt request output method of a semiconductor integrated circuit for outputting an OR output of an external interrupt factor and an internal interrupt factor as an interrupt request signal to an outside, wherein an output end of the interrupt request signal is controlled to a high impedance and the output end of the interrupt request signal and an input end of the external interrupt factor are bypassed through switching means to be closed when an internal power source is shut-off during the breaking of the internal power source, and an interrupt request signal supplied to the input end of the external interrupt factor is output to the outside.

4. An interrupt request output method of a semiconductor integrated circuit for outputting an OR output of an interrupt request signal sent from an external interrupt factor and an internal interrupt factor as an interrupt request signal to an outside, wherein an output end of the interrupt request signal is controlled to a high impedance and the output end of the interrupt request signal and an input end of the external interrupt factor are bypassed through switching means to be closed when an external control signal is supplied during the supply of the external control signal, and an interrupt request signal supplied to the input end of the external interrupt factor is output to the outside.

* * * * *